US010114275B2

United States Patent
Ito et al.

(10) Patent No.: US 10,114,275 B2
(45) Date of Patent: Oct. 30, 2018

(54) LIGHT SOURCE APPARATUS AND PROJECTION-TYPE IMAGE DISPLAY APPARATUS INCLUDING LIGHT SOURCE APPARATUS

(71) Applicant: Mitsubishi Electric Corporation, Tokyo (JP)

(72) Inventors: Daisuke Ito, Tokyo (JP); Tatsuro Hirose, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 14 days.

(21) Appl. No.: 15/309,530

(22) PCT Filed: Jun. 6, 2014

(86) PCT No.: PCT/JP2014/065147
§ 371 (c)(1),
(2) Date: Nov. 8, 2016

(87) PCT Pub. No.: WO2015/186258
PCT Pub. Date: Dec. 10, 2015

(65) Prior Publication Data
US 2017/0146895 A1    May 25, 2017

(51) Int. Cl.
*G03B 21/16* (2006.01)
*G03B 21/20* (2006.01)
(Continued)

(52) U.S. Cl.
CPC ........... *G03B 21/16* (2013.01); *G03B 21/206* (2013.01); *G03B 21/2013* (2013.01);
(Continued)

(58) Field of Classification Search
CPC ............... G03B 21/16; G03B 21/2033; G03B 21/2013; G03B 21/2053; G03B 21/206;
(Continued)

(56) References Cited

U.S. PATENT DOCUMENTS

2007/0058350 A1    3/2007  Nakamura
2007/0103646 A1*   5/2007  Young .................. G01J 1/32
                                                      353/52
(Continued)

FOREIGN PATENT DOCUMENTS

JP    2000-040850 A    2/2000
JP    2003-273445 A    9/2003
(Continued)

OTHER PUBLICATIONS

International Search Report of the International Searching Authority dated Mar. 10, 2015 for the corresponding International application No. PCT/JP2014/065147 (and English translation).
(Continued)

*Primary Examiner* — Christina Riddle
*Assistant Examiner* — Christopher Lamb, II
(74) *Attorney, Agent, or Firm* — Posz Law Group, PLC

(57) ABSTRACT

A laser light source module includes a plurality of unit laser light source modules, each of which emits laser light of one specific color, and when the laser light source module includes unit laser light source modules of at least two colors, and each unit laser light source module has a median of a temperature range in which a practical luminance is obtained, the unit laser light source modules are thermally connected to an evaporator and arrayed in descending sequence of their values of the median from an upstream side in a direction in which a refrigerant flows.

12 Claims, 2 Drawing Sheets

(51) Int. Cl.
*H01S 5/024* (2006.01)
*H01S 5/40* (2006.01)

(52) U.S. Cl.
CPC ...... *G03B 21/2033* (2013.01); *H01S 5/02423* (2013.01); *H01S 5/02469* (2013.01); *H01S 5/4093* (2013.01)

(58) Field of Classification Search
CPC ... H01S 5/4093; H01S 5/024–5/02492; H04N 9/3144; H04N 9/3155; H04N 9/3161; H04N 9/3164
See application file for complete search history.

(56) References Cited

U.S. PATENT DOCUMENTS

| | | | |
|---|---|---|---|
| 2010/0118902 A1 | 5/2010 | Wu | |
| 2010/0171935 A1* | 7/2010 | Yamagishi | G03B 21/16 353/52 |
| 2011/0032489 A1* | 2/2011 | Kimoto | G03B 21/16 353/56 |
| 2011/0037954 A1* | 2/2011 | Tsuchiya | G03B 21/16 353/54 |
| 2011/0194578 A1* | 8/2011 | Hirose | H01S 5/02469 372/36 |

FOREIGN PATENT DOCUMENTS

| | | |
|---|---|---|
| JP | 2007-071806 A | 3/2007 |
| JP | 2009-042703 A | 2/2009 |
| JP | 2009-086269 A | 4/2009 |
| JP | 2012-042699 A | 3/2012 |
| JP | 2012-059993 A | 3/2012 |
| JP | 2012-175086 A | 9/2012 |
| JP | 2013-011841 A | 1/2013 |
| JP | 2013-190594 A | 9/2013 |
| WO | 2014/017345 A1 | 1/2014 |

OTHER PUBLICATIONS

Office Action dated Jul. 4, 2017 issued in corresponding JP patent application No. 2016-525658 (and English translation).
Office Action dated Dec. 5, 2017 issued in corresponding JP patent application No. 2016-525658 (and English translation).

* cited by examiner

LIGHT SOURCE APPARATUS AND PROJECTION-TYPE IMAGE DISPLAY APPARATUS INCLUDING LIGHT SOURCE APPARATUS

CROSS REFERENCE TO RELATED APPLICATION

This application is a U.S. national stage application of PCT/JP2014/065147 filed on Jun. 6, 2014, the contents of which are incorporated herein by reference.

TECHNICAL FIELD

The present invention relates to a light source apparatus and a projection-type image display apparatus including the light source apparatus.

BACKGROUND ART

Hitherto, there have been known projection-type image display apparatus including a light source, an optical modulator configured to modulate light emitted from the light source, and a projection unit configured to project, on a projection surface, the light being modulated by the optical modulator.

In many cases, the related-art projection-type image display apparatus employ a lamp as a light source configured to generate light of three primary colors, and are configured to separate white light, which is emitted from the lamp, with a dichroic mirror into three primary colors: red (R), green (G), and blue (B), modulate the three primary colors based on image information, synthesize the modulated colors with a synthesizing prism, and display the resultant on a screen through a projection lens.

In recent years, demands for a still higher luminance (higher output), a wider color gamut, and a longer life have been increased. However, it is difficult to achieve a still higher luminance with a lamp light source because the lamp light source causes problems such as increase in heat generation amount, increase in cooling structure in size, noise, and increase in power source in size. It is also difficult to achieve a wider color gamut and a longer life with a lamp light source.

In view of the above, in recent years, there have been developed, instead of a lamp light source, light sources using a plurality of semiconductor lasers or LEDs having a wide color gamut and long life as light source elements, thereby being capable of obtaining high output, and projection-type image display apparatus using such light sources.

In order to cause semiconductor lasers, LEDs, and other elements of respective colors (R, G, and B) to stably emit light or oscillate, it is important to keep operating setting temperatures thereof constant. When a light source element is a semiconductor laser, the light emission efficiency of the semiconductor laser increases as the temperature of the semiconductor laser thereof decreases. In general, Peltier elements are used in a technology for cooling semiconductor lasers. However, heat loads of those elements are large, and hence there arise problems such as increase in size of heat pipe and a heat sink, increase in noise due to increased air volume of fans, and increase in power consumption.

Meanwhile, a cooling method using water cooling can suppress heat loads as compared to a case of using Peltier elements. However, there is a significant difference between the temperatures of water at an inlet of a cooler and at an outlet thereof, and hence temperatures of a plurality of semiconductor lasers cannot be kept constant. As a result, stable output light cannot be supplied.

As one method for solving the problems described above, there has been proposed a method in which a cooling apparatus including a refrigerant circuit including a compressor, a condenser, a fan, a pressure reducer, and an evaporator (cooler) is used, and latent heat generated by vaporization of refrigerant is utilized (for example, see Patent Literatures 1 and 2).

In Patent Literature 1, there is proposed a system in which temperature is kept constant by connection of refrigerant pipes to light source elements directly or indirectly through heat pipes. Meanwhile, in Patent Literature 2, there is proposed a system in which temperature is adjusted by controlling heating units provided to light source elements.

CITATION LIST

Patent Literature

Patent Literature 1: Japanese Unexamined Patent Application Publication No. 2009-042703 (for example, see [0025] to [0028], and FIG. 2)

Patent Literature 2: Japanese Unexamined Patent Application Publication No. 2009-086269 (for example, see [0026] to [0029], and FIG. 3)

SUMMARY OF INVENTION

Technical Problem

In Patent Literature 1, no heating unit is provided on a cooling apparatus side, and hence a refrigerant temperature is decreased when the apparatus is activated and a cooling (cooling apparatus) side is activated before a heat source (light source element) side. When the refrigerant temperature reaches a dew point or less, dew condensation occurs in the apparatus to cause short-circuit in the apparatus, leading to apparatus failure. Further, when the apparatus is activated and the heat source side is activated before the cooling side, temperatures of the light source elements are increased due to insufficient supply of refrigerant, leading to apparatus failure. In addition, refrigerant, which is not evaporated in the cooler and is thus in a liquid state, flows into the compressor, leading to compressor failure. Thus, decrease in reliability of the apparatus is a problem.

In Patent Literature 2, the heating units are directly provided to the light source elements, and hence temperatures of the light source elements are increased when a heating amount of the heating units is larger than a heat generation amount of the light source elements, thereby disadvantageously shortening the lives of the elements. In addition, a heating amount is determined based only on temperatures of the light source elements, and hence a state of refrigerant on a suction side of the compressor cannot be determined. As a result, refrigerant in a liquid state often returns to the compressor, leading to problematic compressor failure.

The present invention has been made in view of the problems as described above, and has an object to provide a light source apparatus capable of improving reliability and a projection-type image display apparatus including the light source apparatus.

Solution to Problem

According to one embodiment of the present invention, there is provided a light source apparatus including: a laser light source module; a cooling device including a refrigerant circuit in which a compressor, a condenser, an expansion valve, and an evaporator are sequentially circularly connected to each other via a pipe, and which circulates a refrigerant; and a controller configured to control at least the cooling device, in which the laser light source module includes a plurality of unit laser light source modules, each of which emits laser light of one specific color, and when the laser light source module includes unit laser light source modules of at least two colors, and each unit laser light source module has a median of a temperature range in which a practical luminance is obtained, the unit laser light source modules are thermally connected to the evaporator and arrayed in descending sequence of their values of the median from an upstream side in a direction in which the refrigerant flows.

Advantageous Effects of Invention

According to the light source apparatus of the present invention, the unit laser light source modules are thermally connected to the pipe and arrayed in descending sequence of their values of the median of the temperature range in which a practical luminance can be obtained, from the upstream side in the direction in which the refrigerant flows. With this configuration, the reliability of the laser light source modules can be improved.

DESCRIPTION OF EMBODIMENTS

Figure 1:
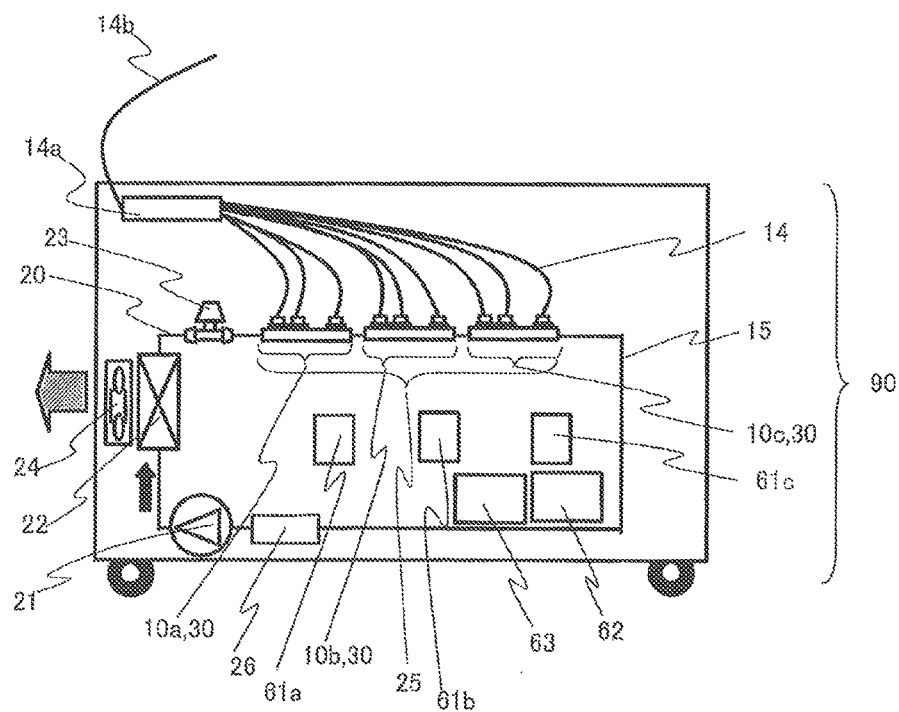
FIG. 1 is an overall configuration diagram of a light source apparatus according to Embodiment 1 of the present invention.

Embodiments of the present invention are described below with reference to the drawings. Note that, the present invention is not limited to the embodiments described below. Moreover, in the drawings referred to below, the size relationship between components may be different from reality in some cases.

Embodiment 1

Figure 2:
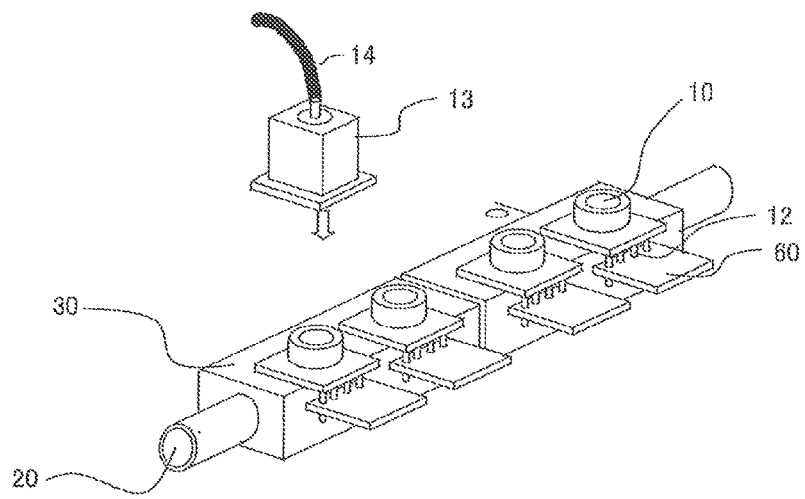
FIG. 2 is an enlarged view of main parts of a cooling apparatus to be mounted in the light source apparatus according to Embodiment 1 of the present invention.

FIG. 1 shows a general schematic configuration of a light source apparatus 90 according to Embodiment 1 of the present invention, and FIG. 2 is an enlarged view of main parts of a cooling apparatus 15 to be mounted in the light source apparatus 90 according to Embodiment 1 of the present invention.

The light source apparatus 90 according to Embodiment 1 includes laser light source modules 10, optical units 13, optical fibers 14, an optical fiber collecting portion 14a, an optical fiber bundle line 14b, the cooling apparatus 15, heat blocks 30, electric boards 60, laser light source driving circuit boards 61, a power source circuit board 62, and a control circuit board 63.

The laser light source modules 10 include a green laser light source module 10a configured to emit green (G) laser light, a red laser light source module 10b configured to emit red (R) laser light, and a blue laser light source module 10c configured to emit blue (B) laser light.

Further, the laser light source driving circuit boards 61 include a green laser light source driving circuit board 61a, a red laser light source driving circuit board 61b, and a blue laser light source driving circuit board 61c configured to drive the laser light source modules 10 of the respective colors (R, G, and B). The green laser light source module 10a, the red laser light source module 10b, and the blue laser light source module 10c each correspond to a "unit laser light source module" of the present invention.

Further, the laser light source modules 10 each include an electric terminal portions 12, and are configured to emit laser light when being supplied with electricity via the electric board 60. Then, the emitted laser light is guided to the optical fiber 14 via the optical unit 13.

The optical fibers 14 are connected to the laser light source modules 10 of the respective colors. Laser light emitted from the laser light source modules 10 is output to the outside of the laser light source through the optical fibers 14, the optical fiber collecting portion 14a, and the optical fiber bundle line 14b.

The power source circuit board 62 is a circuit board configured to supply power to the light source apparatus 90. The control circuit board 63 is a circuit board configured to control the light source apparatus 90. The control circuit board 63 corresponds to a "controller" of the present invention.

The cooling apparatus 15 includes a refrigerant circuit in which a compressor 21, a condenser 22, an expansion valve 23, and an evaporator 25 configured to cool the laser light source modules 10 are sequentially circularly connected to each other, via a pipe 20, and which circulates refrigerant. Further, a fan 24 for ventilation is provided to the condenser 22.

Refrigerant flows through the pipe 20. A plurality of heat blocks 30, which are radiators, are mounted on the pipe 20 between the expansion valve 23 and the compressor 21. The evaporator 25 is formed by a segment of the pipe 20 between the expansion valve 23 and the compressor 21, and the heat blocks 30. Further, the laser light source modules 10 are joined to the heat blocks 30. That is, the pipe 20 and the laser light source modules 10 are thermally connected to each other via the heat blocks 30. The laser light source modules 10 are cooled by refrigerant flowing through the pipe 20.

Specifically, high-temperature and high-pressure refrigerant compressed in the compressor 21 exchanges heat with outside air, which is ventilated due to the working of the condenser 22 and the fan 24, to decrease its temperature, thereby becoming low-temperature and high-pressure refrigerant. At the same time, the condensing heat is rejected to the outside of the light source apparatus 90 by the fan 24. Next, the refrigerant is decompressed by the expansion valve 23, and then takes away heat by absorbing evaporation latent heat (that is, cools the laser light source module 10), thereby becoming low-temperature and low-pressure refrigerant. This occurs when the refrigerant flows through the pipe 20, on which the heat blocks 30 are mounted with the laser light source modules 10 joined thereto. Through the series operation of what is called heat pump operation, heat generated by the laser light source modules 10 is continuously discharged to the outside of the light source apparatus 90, thereby keeping temperatures of the laser light source modules 10 constant.

Due to this action of the refrigerant circuit, a refrigerant temperature in the pipe 20 of FIG. 2, on which the heat blocks 30 are mounted, is decreased to a peripheral temperature of the pipe 20 or less. Further, a temperature of the surface of the pipe 20 on a low-pressure side (the suction side of the compressor 21) is decreased to approximate the refrigerant temperature. Further, temperatures at joints between the laser light source modules 10 and the heat blocks 30 are increased due to heat generated from the laser light source modules 10, but surfaces of the heat blocks 30 other than the joints are less affected by heat. Thus, the temperatures of the surfaces are decreased to approximate the refrigerant temperature. Then, when those temperatures reach a dew point or less, dew condensation occurs on the pipe 20 on the low-pressure side and the surfaces of the heat blocks 30.

In order to prevent such dew condensation, in Embodiment 1, the refrigerant circuit, namely, the cooling apparatus 15 includes the heater 26. Through control of the heater 26, the refrigerant temperature is adjusted so as not to reach the dew point or less, thereby preventing dew condensation. When the apparatus is activated and the compressor 21 of the cooling apparatus 15 is activated first, temperatures of the pipe 20 and the heat blocks 30 are decreased because the laser light source modules 10 do not generate heat yet, and hence dew condensation occurs on the surfaces of those components. On the other hand, when the laser light source modules 10 are activated first, temperatures of the laser light source modules 10 are immediately increased because the compressor 21 of the cooling apparatus 15 is not activated yet, thereby causing failure of the laser light source modules 10 or shortening the lives of the laser light source modules 10.

Accordingly, when the apparatus is activated, the heater 26 is activated first to warm the refrigerant. The compressor 21 is then activated such that the refrigerant temperature is adjusted so as not to reach the dew point or less. After that, the laser light source modules 10 are activated. In this manner, increase in temperature of the laser light source modules 10 is prevented.

Further, the heater 26 is provided, and hence refrigerant to be sucked into the compressor 21 can be turned into a vapor state at the same time as adjustment of an evaporating temperature of refrigerant. In this case, when the heater 26 is controlled such that refrigerant in the vapor state is sucked into the compressor 21, it is difficult to perform the simultaneous control as described above if the heater 26 is directly provided to the laser light source modules 10. Consequently, (when the discharge side of the compressor 21 corresponds to the upstream, and the suction side thereof corresponds to the downstream) refrigerant flowing near the blue laser light source module 10c of the laser light source modules 10, which is located on the most downstream side, may become superheated vapor and may not be cooled, or refrigerant not in the vapor state may be sucked into the compressor 21.

Accordingly, the heater 26 is provided in the refrigerant circuit on the low-pressure side (between the evaporator 25 and the suction port of the compressor 21 in Embodiment 1) so that refrigerant in the vapor state can be sucked into the compressor 21 while the evaporator 25 causes refrigerant in a wet state to flow. As a result, not only the reliability of the laser light source modules 10, but also the reliability of the compressor 21 can be improved.

Further, no dew condensation collecting container is needed, and a plurality of heaters 26 are not needed in the circuit. Thus, the apparatus can be manufactured at a low cost. The refrigerant temperature may be adjusted merely by controlling the heater 26 depending on a heat generation amount of the laser light source modules 10, based on the lowest pipe temperatures in the laser light source modules 10 and the suction temperature of the compressor 21, and hence the refrigerant temperature can be adjusted more easily than in a case of using a plurality of heaters 26.

Further, only one heater 26 is provided in Embodiment 1, and hence the cost can be reduced. Further, control of a plurality of heaters 26 is not needed, which means that the control is not complicated and the responsiveness of the apparatus can thus be improved.

Heaters 26 may be provided on the upstream side of the laser light source modules 10 and the downstream side thereof, respectively. With this configuration, an evaporating temperature of refrigerant can be adjusted by controlling the heater 26 on the upstream side, and a state of refrigerant to be sucked into the compressor 21 can be adjusted by controlling the heater 26 on the downstream side.

As described above, in the light source apparatus 90 including the cooling apparatus 15 according to Embodiment 1, the occurrence of dew condensation in the apparatus, which causes short-circuit in the apparatus 15, is prevented due to dew condensation prevention by the heater 26, and hence the light source apparatus 90 with high reliability is obtained.

Further, light emitting portion temperatures of laser diodes in the laser light source modules 10 are decreased, and hence the light source apparatus 90 has a characteristic of high opto-electric conversion efficiency. Thus, when the refrigerant temperature is decreased as described above, light output to the outside of the light source apparatus 90 is increased. As a result, the number of laser light source modules 10 necessary for obtaining light output that the light source apparatus 90 is required to output can be reduced, thereby reducing the cost of the light source apparatus 90.

Further, refrigerant to be sucked into the compressor 21 can be turned into the vapor state at the same time as the adjustment of the refrigerant temperature by the evaporator 25. Thus, the reliability of the compressor 21 can be improved.

Figure 3:
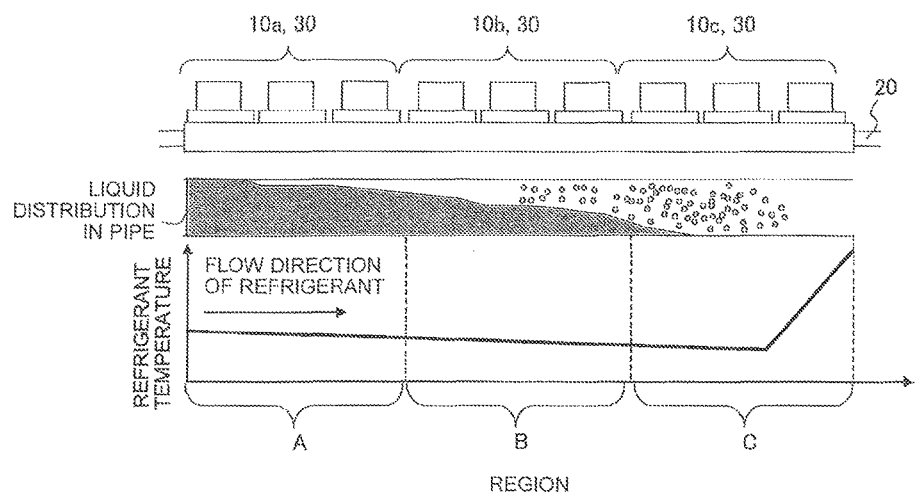
FIG. 3 is a diagram for illustrating laser light source modules of the light source apparatus according to Embodiment 1 of the present invention, and liquid dispersion therein.

FIG. 3 is a diagram for illustrating the laser light source modules 10 of the light source apparatus 90 according to Embodiment 1 of the present invention, and liquid dispersion therein.

In FIG. 3, in the flow direction of refrigerant, the most upstream region is referred to as a region A, the most downstream region is referred to as a region C, and a region between the region A and the region C is referred to as a region B.

In Embodiment 1, as illustrated in the liquid dispersion in the pipe 20 of FIG. 3, a liquid volume of liquid refrigerant is increased in the order of region A>region B>region C for refrigerant in a two-phase gas-liquid state. In the region C, the liquid volume of the refrigerant is small and superheated vapor flows, and hence latent heat of the refrigerant is small. Further, as refrigerant travels downstream, the ratio of vapor refrigerant having a high velocity is increased and pressure loss of the refrigerant is thus increased. The increase in pressure loss decreases an evaporating pressure of the refrigerant and an evaporating temperature thereof, and hence a temperature of a cooling surface is decreased. Accordingly, in the light source apparatus 90 having a refrigerant temperature distribution, the laser light source module 10 having a high median of a control temperature range (a temperature range in which a practical luminance can be obtained) is provided on the upstream side (region A or region B). As a result, the laser light source modules 10 are easily controlled to have a temperature in a desired temperature range, and hence stable wavelengths can be supplied from the laser light source modules 10. With the above-mentioned configuration, the reliability of the laser light source modules 10 can be improved and stable laser light can thus be emitted.

In Embodiment 1, as illustrated in FIG. 3, the laser light source modules 10 of the respective colors (R, G, and B) are arranged in line, but the arrangement is not limited thereto. Further, the combination of colors and the number of laser light source modules 10 may differ from those of Embodiment 1. The laser light source modules 10 may be arranged in parallel to each other, but for each line, the laser light source module 10 having a high control temperature is preferably arranged on the upstream side.

Embodiment 2

Now, Embodiment 2 of the present invention is described. Description of the same component as that of Embodiment 1 is omitted herein. The parts identical with or corresponding to those of Embodiment 1 are denoted by the same reference symbols.

In Embodiment 1 described above, a case is described in which, among a plurality of laser light source modules 10, the laser light source module 10 having a high median of the control temperature range is provided on the upstream side of the laser light source module 10 having a low median of the control temperature range. In Embodiment 2, a case is described in which, among a plurality of laser light source modules 10, the green laser light source module 10a is provided on the upstream side of the laser light source modules 10 of other colors.

The median of the control temperature range of the green laser light source module 10a is higher than that of the laser light source module 10 of red or blue. Thus, the green laser light source module 10a is provided on the upstream side of the laser light source modules 10 of other colors (in the region A). As a result, the green laser light source module 10a is easily controlled to have a temperature in a desired temperature range, and hence a stable wavelength can be supplied from the green laser light source module 10a. With this configuration, the reliability of the laser light source modules 10 can be improved and stable laser light can thus be emitted.

Embodiment 3

Now, Embodiment 3 of the present invention is described. Description of the same component as that of Embodiment 1 is omitted herein. The parts identical with or corresponding to those of Embodiment 1 are denoted by the same reference symbols.

In Embodiment 2 described above, a case is described in which, among a plurality of laser light source modules 10, the green laser light source module 10a having the highest median of the control temperature range is provided on the upstream side of the laser light source modules 10 of other colors. In Embodiment 3, among a plurality of laser light source modules 10, the red laser light source module 10b is provided on the downstream side of the laser light source modules 10 of other colors.

The median of the control temperature range of the red laser light source module 10b is lower than that of the laser light source module 10 of green or blue. Thus, the red laser light source module 10b is provided on the downstream side of the laser light source modules 10 of other colors (in the region C). As a result, a change in temperature of the red laser light source module 10b can be minimized, and the laser light source modules 10 of other colors can have temperatures in the control temperature range. Thus, the light source apparatus 90 can be controlled easily and stable wavelengths can be emitted for all the colors. Further, only one sensor is needed for sensing cooling temperature, and hence the cost can be reduced.

Embodiment 4

Now, Embodiment 4 of the present invention is described. Description of the same component as that of Embodiment 1 is omitted herein. The parts identical with or corresponding to those of Embodiment 1 are denoted by the same reference symbols.

In Embodiment 3 described above, a case is described in which, among a plurality of laser light source modules 10, the red laser light source module 10b having the lowest median of the control temperature range is provided on the downstream side of the laser light source modules 10 of other colors. In Embodiment 4, a case is described in which a temperature of the green laser light source module 10a (in the light source apparatus 90) is controlled to be included in a range of from the dew point or more to 45 degrees C. or less.

The green laser light source module 10a has temperature dependence on wavelengths due to its element characteristics, and thus does not provide a practical luminance unless otherwise controlled to have a temperature in the range of from the dew point or more to 45 degrees C. or less. When being controlled to have a temperature in this range, the green laser light source module 10a can provide a high luminance and a stable wavelength due to its element characteristics. Further, reduction in luminance with respect to reduction in time is small, and hence a long-life light source apparatus 90 can be obtained. Further, the green laser light source module 10a is controlled to have a temperature that is the dew point or more, and hence dew condensation of the green laser light source module 10a can be prevented.

Embodiment 5

Now, Embodiment 5 of the present invention is described. Description of the same component as that of Embodiment 1 is omitted herein. The parts identical with or corresponding to those of Embodiment 1 are denoted by the same reference symbols.

In Embodiment 4 described above, a case is described in which a temperature of the green laser light source module 10a is controlled to be included in the range of from the peripheral temperature or more to 45 degrees C. or less. In Embodiment 5, a case is described in which a temperature of the red laser light source module 10b is controlled to be included in a range of from 20 degrees C. or more to 30 degrees C. or less.

The red laser light source module 10b has temperature dependence on wavelengths due to its element characteristics, and thus does not provide a practical luminance unless otherwise controlled to have a temperature in the range of from 20 degrees C. or more to 30 degrees C. or less. When being controlled to have a temperature in this range, the red laser light source module 10b can provide a high luminance and a stable wavelength due to its element characteristics. Further, reduction in luminance with respect to reduction in time is small, and hence a long-life light source apparatus 90 can be obtained.

Embodiment 6

Now, Embodiment 6 of the present invention is described. Description of the same component as that of Embodiment 1 is omitted herein. The parts identical with or corresponding to those of Embodiment 1 are denoted by the same reference symbols.

In Embodiment 5 described above, a case is described in which a temperature of the red laser light source module 10b is controlled to be included in the range of from 20 degrees C. or more to 30 degrees C. or less. In Embodiment 6, a case is described in which a temperature of the blue laser light source module 10c is controlled to be included in a range of from 27 degrees C. or more to 33 degrees C. or less.

The blue laser light source module 10c has temperature dependence on wavelengths due to its element characteristics, and thus does not provide a practical luminance unless otherwise controlled to have a temperature in the range of from 27 degrees C. or more to 33 degrees C. or less. When being controlled to have a temperature in this range, the blue laser light source module 10c can provide a high luminance and a stable wavelength due to its element characteristics. Further, reduction in luminance with respect to reduction in time is small, and hence a long-life light source apparatus 90 can be obtained.

Embodiment 7

Figure 4:
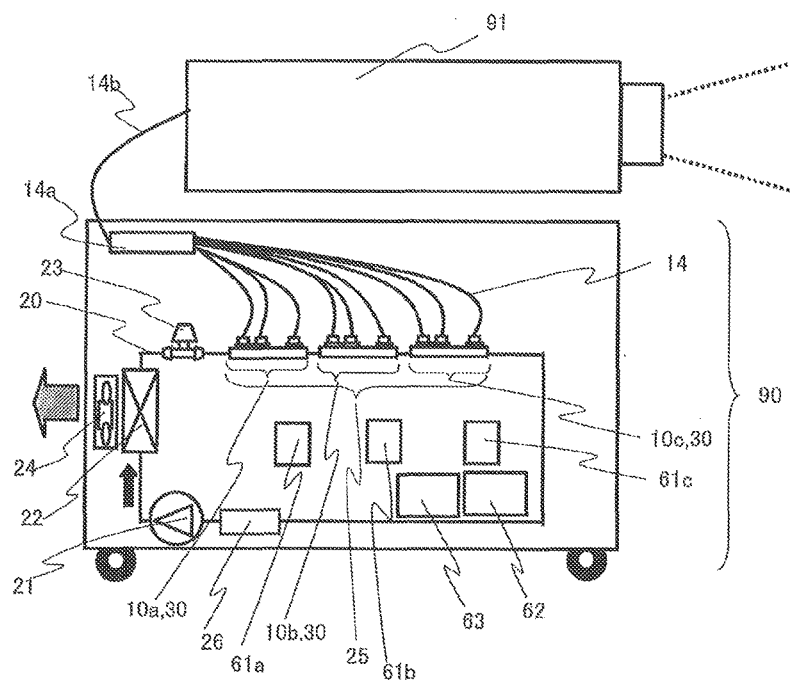
FIG. 4 is an overall configuration diagram of a projection-type image display apparatus including a light source apparatus according to Embodiment 7 of the present invention.

FIG. 4 is an overall configuration diagram of a projection-type image display apparatus 91 including the light source apparatus 90 according to Embodiment 7 of the present invention.

Now, Embodiment 7 is described. Description of the same component as that of Embodiment 1 is omitted herein. The parts identical with or corresponding to those of Embodiment 1 are denoted by the same reference symbols.

In Embodiment 6 described above, a case is described in which a temperature of the red laser light source module 10b is controlled to be included in the range of from 20 degrees C. or more to 30 degrees C. or less. In Embodiment 7, the projection-type image display apparatus 91 includes the light source apparatus 90 is described.

As illustrated in FIG. 4, the projection-type image display apparatus 91 according to Embodiment 7 is connected to the optical fiber collecting portion 14a of the light source apparatus 90 via the optical fiber bundle line 14b. The projection-type image display apparatus 91 includes a unit configured to generate image light through space modulation of laser light and a projection optical system configured to project the image light, and is configured to project images to the outside of the projector with the unit and the projection optical system.

The projection-type image display apparatus 91 according to Embodiment 6 can achieve high reliability, low cost, and high energy efficiency.

REFERENCE SIGNS LIST 10 laser light source module 10a green laser light source module 10b red laser light source module 10c blue laser light source module 12 electric terminal portion 13 optical unit 14 optical fiber 14a optical fiber collecting portion 14b optical fiber bundle line 15 cooling apparatus 20 pipe 21 compressor 22 condenser 23 expansion valve 24 fan 25 evaporator 26 heater 26a heater 26b heater 27 first temperature sensor 28 second temperature sensor 29 heat exchanger 30 heat block 60 electric board 61 laser light source driving circuit board 61a green laser light source driving circuit board 61b red laser light source driving circuit board 61c blue laser light source driving circuit board 62 power source circuit board 63 control circuit board 90 light source apparatus 91 projection-type image display apparatus

The invention claimed is:

1. A light source apparatus comprising:
a cooling device including a refrigerant circuit in which a compressor, a condenser, an expansion valve, and an evaporator are circularly connected sequentially via a pipe, and which is configured to circulate a refrigerant;
a laser light source module comprising a plurality of unit laser light source modules each being configured to emit laser light of one color and being attached to the evaporator;
a controller configured to control at least the cooling device; and
a heater provided between the evaporator and a suction side of the compressor of the refrigerant circuit, wherein
the controller is configured to activate the compressor after activating the heater, and to activate the laser light source module after activating the compressor.

2. The light source apparatus of claim 1, wherein the evaporator comprises a segment of the pipe, the segment of the pipe is positioned between the compressor and the expansion valve, and the segment of the pipe is attached to the laser light source module.

3. The light source apparatus of claim 1, wherein at least one of the plurality of unit laser light source modules comprises a green laser light source module configured to emit green laser light, and the green laser light source module is attached to the evaporator on an upstream side of a rest of the plurality of unit laser light source modules in a direction in which the refrigerant flows, the rest of the plurality of unit laser light source modules being configured to emit laser light of another color than green.

4. The light source apparatus of claim 3, wherein the controller is configured to control the green laser light source module to have a temperature in a range of from a dew point within the light source apparatus or more to 45 degrees C. or less.

5. The light source apparatus of claim 1, wherein at least one of the plurality of unit laser light source modules comprises a red laser light source module configured to emit red laser light, and the red laser light source module is attached to the evaporator on a downstream side of a rest of the plurality of unit laser light source modules in a direction in which the refrigerant flows, the rest of the plurality of unit laser light source modules being configured to emit laser light of another color than red.

6. The light source apparatus of claim 5, wherein the controller is configured to control the red laser light source module to have a temperature in a range of from 20 degrees C. or more to 30 degrees C. or less.

7. The light source apparatus of claim 1, wherein at least one of the plurality of unit laser light source modules comprises a blue laser light source module configured to emit blue laser light, and the controller is configured to control the blue laser light source module to have a temperature in a range of from 27 degrees C. or more to 33 degrees C. or less.

8. A projection image display apparatus, comprising the light source apparatus of claim 1.

9. The light-source apparatus of claim 1, wherein the plurality of the unit laser light source modules are configured to emit light of respective colors, the colors being different from one another,
each of the unit laser light source modules has a temperature range in which a practical luminance is obtained, and
the unit laser light source modules are attached to the evaporator and arrayed in descending sequence of their values of median of the temperature range, from an upstream side in a direction in which the refrigerant flows.

10. The light source apparatus of claim 1, wherein the evaporator comprises a segment of the pipe, the segment of the pipe is positioned between the compressor and the expansion valve and includes a heat block mounted to the segment of the pipe, and the laser light source module is attached to the heat block of the evaporator.

11. The light source apparatus of claim 1, wherein the heater is provided on the refrigerant circuit of the cooling device between the evaporator and the suction side of the compressor of the refrigerant circuit.

12. A light source apparatus comprising:
a cooling device including a refrigerant circuit in which a compressor, a condenser, an expansion valve, and an evaporator are circularly connected sequentially via a pipe, and which is configured to circulate a refrigerant;
a laser light source module including a plurality of unit laser light source modules each being configured to emit laser light of one color and being thermally connected to the evaporator;
a controller configured to control at least the cooling device; and
a heater provided between the evaporator and a suction side of the compressor of the refrigerant circuit, wherein
the controller is configured to activate the compressor after activating the heater, and to activate the laser light source module after activating the compressor.

* * * * *